United States Patent [19]
Ito

[11] Patent Number: 5,466,966
[45] Date of Patent: Nov. 14, 1995

[54] LEAD FRAME WITH LEADS PROJECTING ALTERNATELY FROM OPPOSITE SIDES OF A LEAD FRAME BLOCK

[75] Inventor: Seigo Ito, Souka, Japan

[73] Assignee: Kabushiki Kaisha Toshiba, Kawasaki, Japan

[21] Appl. No.: 422,647

[22] Filed: Apr. 14, 1995

Related U.S. Application Data

[63] Continuation of Ser. No. 191,203, Feb. 3, 1994, abandoned.

[30] Foreign Application Priority Data

Feb. 5, 1993 [JP] Japan ................................. 5-018594

[51] Int. Cl.⁶ ..................... H01L 23/48; H01L 29/44; H01L 29/52; H01L 29/60
[52] U.S. Cl. ........................................... 257/666; 257/676
[58] Field of Search ..................................... 257/666, 676

[56] References Cited

U.S. PATENT DOCUMENTS

| | | |
|---|---|---|
| 4,711,700 | 12/1987 | Cusak . |
| 4,872,260 | 10/1985 | Johnson et al. . |
| 5,221,428 | 6/1993 | Ohsawa et al. ............... 257/666 |
| 5,270,570 | 12/1993 | Westerkamp ................... 257/666 |

*Primary Examiner*—Sara W. Crane
*Assistant Examiner*—S. V. Clark
*Attorney, Agent, or Firm*—Finnegan, Henderson, Farabow, Garrett & Dunner

[57] ABSTRACT

The first step is forming belt-like resist films having a predetermined width on one and the other surfaces of a metal plate material alternately at a predetermined interval. The second step is etching the metal plate material from the one and other surfaces thereof to dissolve and remove portions of the metal plate material where the resist films are not formed, thereby forming a plurality of leads having a width corresponding to the resist films.

7 Claims, 9 Drawing Sheets

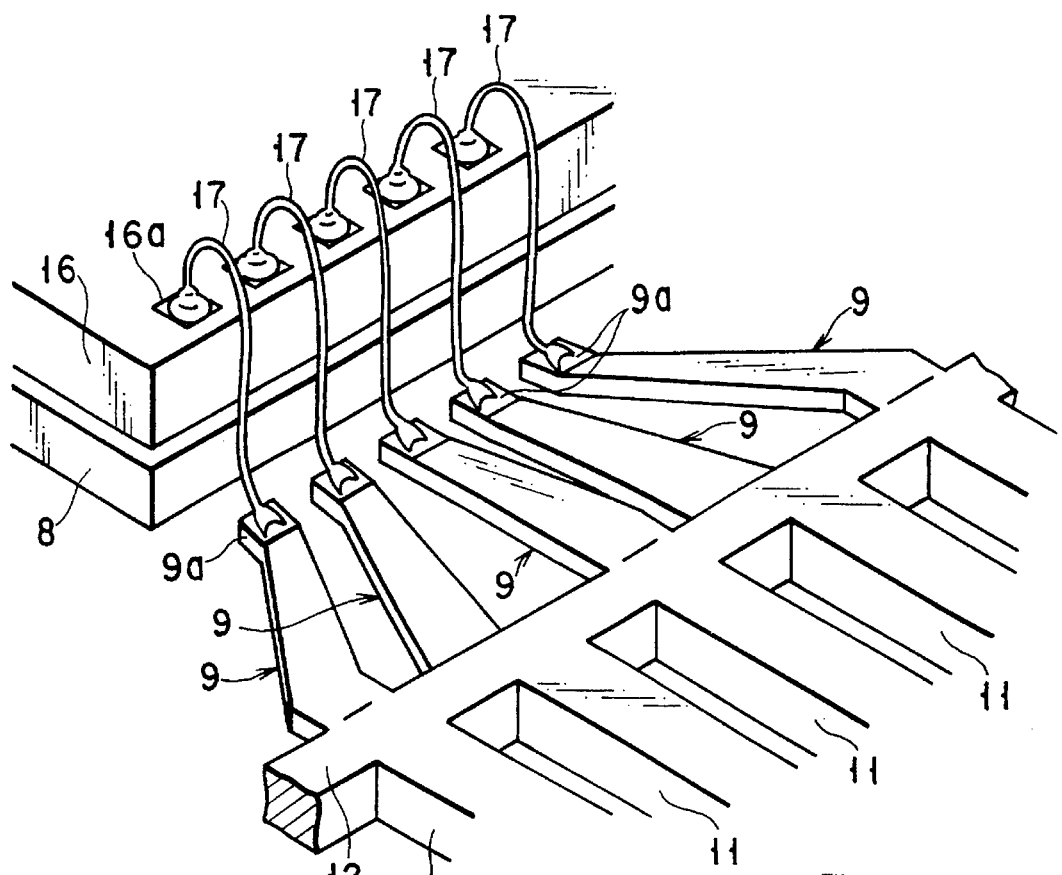
F I G. 5C
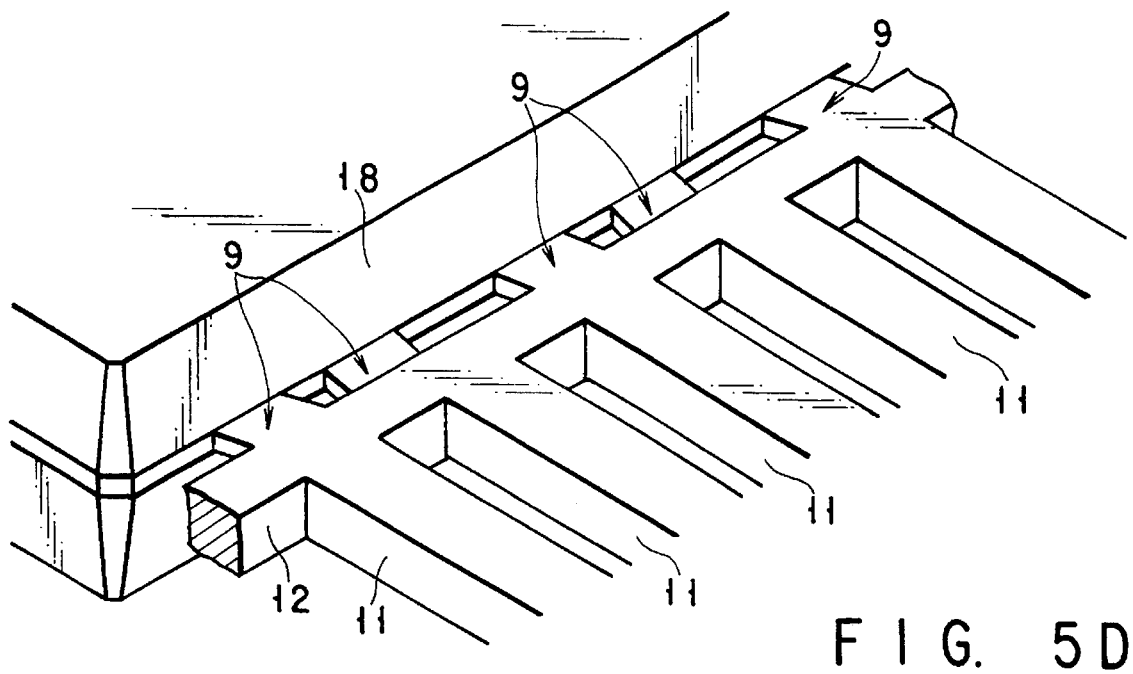
F I G. 5D

LEAD FRAME WITH LEADS PROJECTING ALTERNATELY FROM OPPOSITE SIDES OF A LEAD FRAME BLOCK

This application is a continuation of application Ser. No. 08/191,203, filed Feb. 3, 1994, now abandoned.

BACKGROUND OF THE INVENTION

1. Field of the Invention

The present invention relates to a method of manufacturing a lead frame used for the manufacture of a semiconductor package, and to the lead frame.

2. Description of the Related Art

In recent years, as the integration degree and packaging density of semiconductor integrated circuits have increased, an increase in the size of the semiconductor package and an increase in the number of pins of the semiconductor package have occurred. For example, in gate arrays in which the number of terminals is increased in proportion to the number of gates, one having 300 or more pins has already been produced.

In the manufacture of such a semiconductor package, smaller and more precise leads with a smaller lead pitch with respect to a lead frame on which an IC chip is to be mounted are required.

Conventionally, a lead frame having these small leads is formed in accordance with the etching technique. As the etching technique especially used for formation of the lead frame, a wet etching scheme is employed.

According to this wet etching scheme, as shown in FIG. 9A, belt-like resist films 2 are formed on the upper and lower surfaces of a metal plate material 1, serving as the material of the lead frame and having a thickness t, to have the same width a and the same interval b as those of leads 3 to be formed.

An etchant is sprayed on the two surfaces of the metal plate material 1 to chemically dissolve and thus remove the metal plate material 1, as indicated by arcs A in FIGS. 9B to 9D, except portions where the resist films 2 are formed.

When etching is ended, the resist films 2 are removed by washing, thereby forming the leads 3 having a width a and an interval b, i.e., a pitch P=(a+b), as shown in FIG. 9E.

In the wet etching scheme, as etching progresses, a phenomenon so-called side-etching occurs wherein etching progresses also in the lateral direction of the leads 3, as shown in FIG. 9D.

When the pitch of the leads 3 to be formed is to be decreased, the etching depth (same size of the thickness t) is increased when compared to the etching width (the interval b of the adjacent leads 3), thereby accelerating the side-etching phenomenon. Therefore, it is conventionally difficult to form the leads 3 to have the width a and the interval b that are smaller than the thickness t of the metal plate material 1, and the pitch P=(a+b) of the leads 3 becomes twice or more the thickness of the metal plate material 1.

SUMMARY OF THE INVENTION

It is an object of the present invention to provide a method of manufacturing a lead frame capable of decreasing the interval b of the leads, which is conventionally as large as about the thickness of the metal plate material, to be equal to or smaller than the thickness, thereby decreasing the pitch of the leads, and to provide such a lead frame.

According to the invention described in claim 1 of the present application, there is provided a method of manufacturing a lead frame, comprising: the first step of forming belt-like resist films having a predetermined width on one and the other surfaces of a metal plate material alternately at a predetermined interval; and the second step of etching the metal plate material from the one and the other surfaces thereof to dissolve and remove portions of the metal plate material where the resist films are not formed, thereby forming a plurality of leads having a width corresponding to the resist films.

According to the invention described in claim 9 of the present application, there is provided a method of manufacturing a lead frame, comprising: the first step of forming belt-like resist films having a predetermined width on one and the other surfaces of a metal plate material alternately at a predetermined interval; the second step of etching the metal plate material from the one and the other surfaces thereof to dissolve and remove portions of the metal plate material where the resist films are not formed, thereby forming a plurality of leads having a width corresponding to the resist films; and the third step of aligning heights of distal end portions of the leads after the leads are formed.

According to the invention described in claim 11 of the present application, there is provided a lead frame comprising: a lead frame block formed of a metal plate material having one and the other surfaces; and a plurality of leads formed such that belt-like resist films having a predetermined width on the one and the other surfaces of the metal plate material are alternately formed at a predetermined interval in a staggered manner, and the metal plate material is etched from the one and the other surfaces thereof to dissolve and remove portions of the metal plate material where the resist films are not formed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 5A to 5F are views showing a process of manufacturing a semiconductor package by using a lead frame;

DETAILED DESCRIPTION OF THE PREFERRED EMBODIMENTS

The first embodiment of the present invention will be described with reference to FIGS. 1A to 7.

Figure 2:
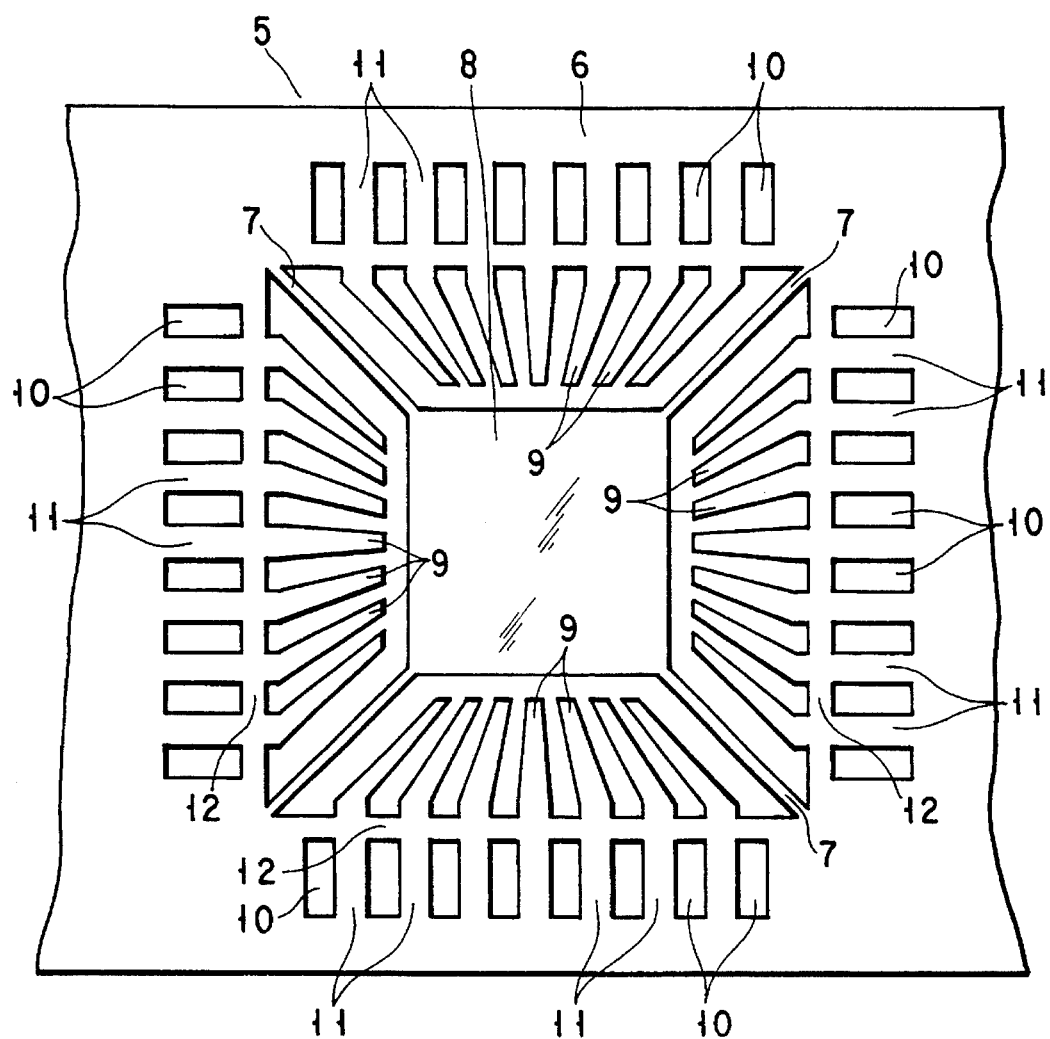
FIG. 2 is a plan view of a lead frame.

FIG. 2 is a plan view of a lead frame 5.

This lead frame 5 is manufactured by press-molding and etching a metal plate material 1 having a predetermined thickness t. The lead frame 5 has a lead frame block 6, a die pad 8 held at the central portion within the lead frame block 6 by suspension pins 7 extending from the lead frame block 6, and a plurality of leads 9 having distal end portions opposing the die pad 8 and proximal end portions held by the lead frame block 6.

A plurality of outer lead holes 10 are formed in the lead frame block 6 so that outer leads 11 having the same width as that of the proximal end portions of the leads 9 are formed on the outer side of the proximal end portions of the leads 9 to be continuous to them. A belt-like portion 12 formed at the boundary of the leads 9 and the outer leads 11 to hold the leads 9 and the outer leads 11 is called a dam bar.

Figure 3:
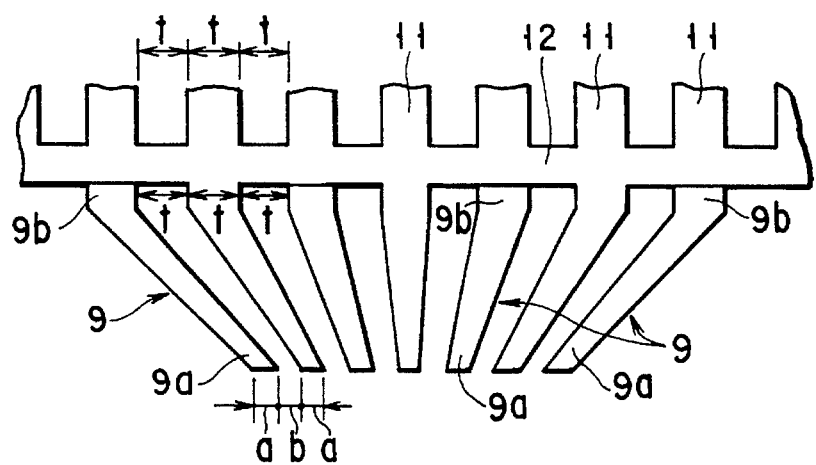
FIG. 3 is a partially enlarged plan view of the lead frame.

FIG. 3 is an enlarged plan view showing the leads 9 of the lead frame 5.

Each lead 9 is formed such that its width and interval with respect to other adjacent leads 9 are gradually decreased from its proximal end portion 9b held by the dam bar 12 toward its distal end portion 9a.

For example, in the lead frame 5 shown in FIG. 3, the interval and width of the proximal end portions 9b of the leads 9 are equal to the thickness t of the metal plate material serving as the material of this lead frame 5, and the distal end portions 9a of the leads 9 are formed to have a width a and an interval b that are smaller than the thickness t, i.e., to have a pitch P=(a+b).

A method of manufacturing this lead frame 5 will be described.

Figure 4:
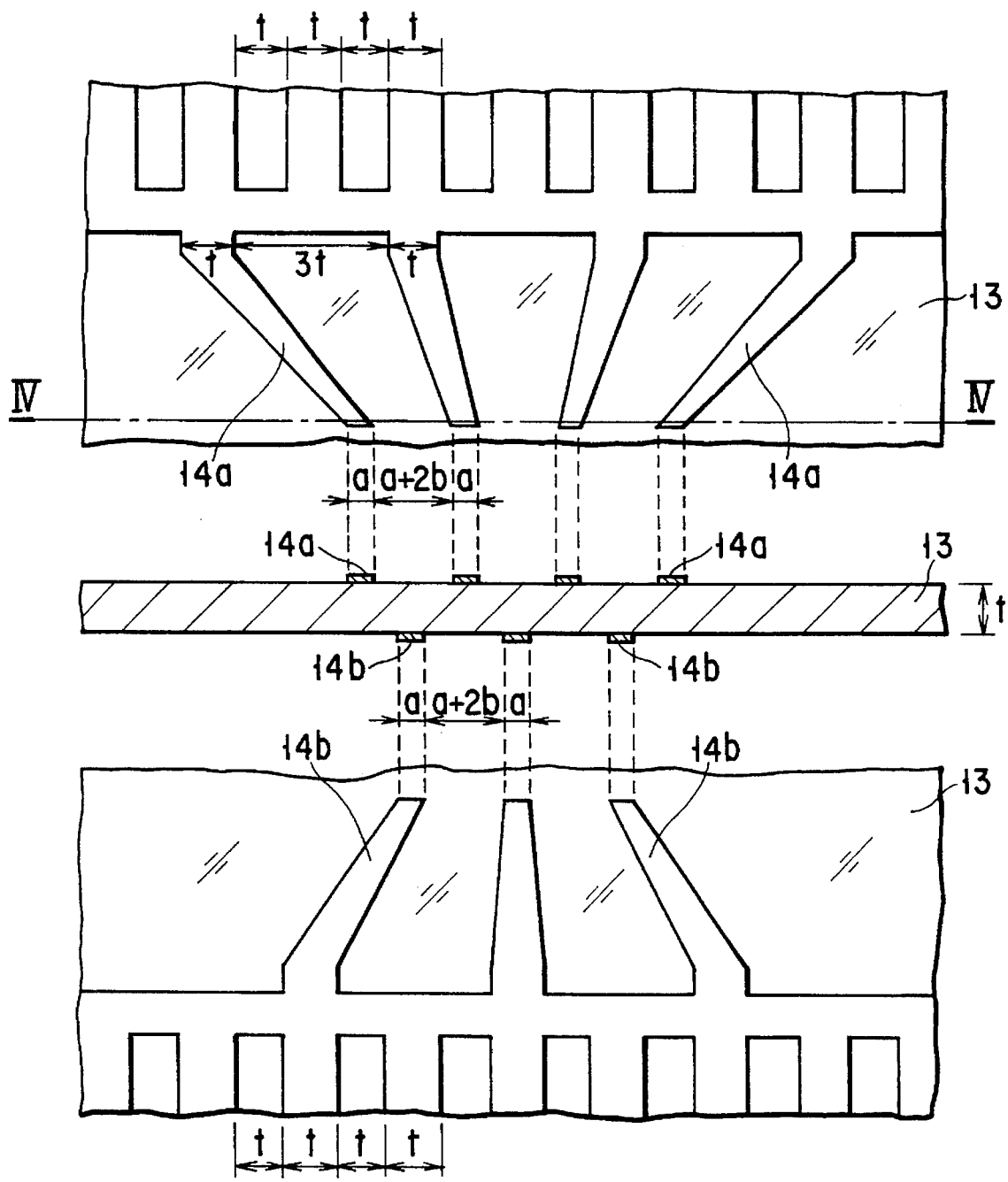
FIG. 4 includes a plan view, a longitudinal sectional view taken along the line IV—IV of the plan view, and a bottom view showing a state wherein resist films are formed on a metal plate material.

To form the lead frame 5 having the above-described shape, resist films 14a and 14b are formed on the upper and lower surfaces of a metal plate material 13 having a thickness t shown in FIG. 4 to have patterns corresponding to the lead frame block 6, the dam bar 12, the leads 9, and the like to be formed.

Some resist films 14a and 14b corresponding to portions other than the leads 9, i.e., corresponding to the dam bar 12, the lead frame block 6, and the like are formed to have the same pattern on the upper and lower surfaces of the metal plate material 13. The belt-like resist films 14a and 14b corresponding to the leads 9 are formed to be alternately located on the upper and lower surfaces of the metal plate material 13 in a staggered manner.

More specifically, when only the resist films 14a formed on the upper surface of the metal plate material 13 are considered, they are formed such that the interval of the adjacent resist films 14a having proximal end portions with a width 5 and distal end portions with a width a is 3t at their proximal end portions and a+2b at their distal end portions.

When the resist films 14b formed on the lower surface of the metal plate material 13 are considered, they are formed at positions shifted by a distance b from the resist films 14a formed on the upper surfaces of the metal plate material 13, such that the interval of the adjacent resist films 14b having proximal end portions with a width t and distal end portions with a width a is 3t at their proximal end portions and a+2b at their distal end portions.

The resist films 14a and 14b having these patterns are formed by, e.g., coating a resist on the entire portions of the upper and lower surfaces of the metal plate material 13, and exposing and developing the coated resist with the patterns described above.

The process of manufacturing the lead frame 5 from the metal plate material 13 having the resist films 14a and 14b formed thereon will be described with reference to FIGS. 1A to 1E by extracting only formation of the leads 9 as the major part of the present invention.

This process will be described only regarding the distal end portions 9a of the leads 9. Since the proximal end portions 9b of the leads 9 are different from the distal end portions 9a only in size and the process of manufacturing them is substantially the same as that for the distal end portions 9a, a detailed description thereof will be omitted.

Figure 1A:
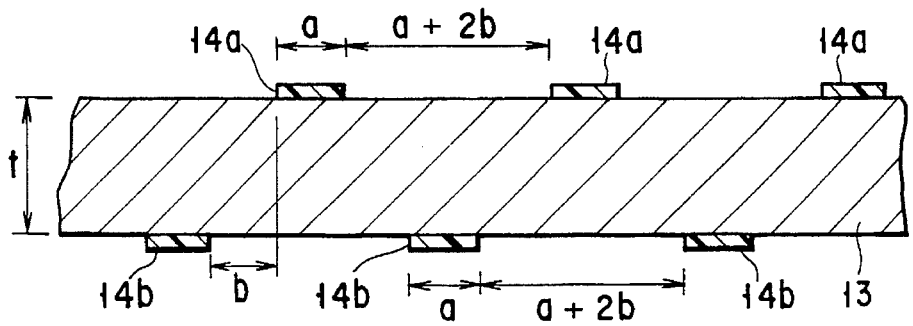
FIGS. 1A to 1E are views showing a process of forming leads according to the first embodiment of the present invention.
Figure 1B:
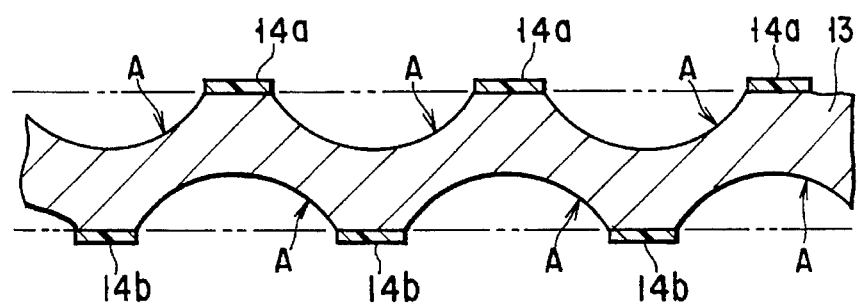

As shown in FIG. 1A, the resist films 14a having substantially the same width a as that of the leads 9 to be formed are formed on the upper surface of the metal plate material 13 having the thickness t with an interval (a+2b). The resist films 14b having the width a are similarly formed on the lower surface of the metal plate material 13 with an interval (a+2b) at positions shifted from the resist films 14a formed on the upper surface.

More specifically, the resist films 14a and 14b having the predetermined width a are alternately formed on the upper and lower surfaces of the metal plate material 13 with the predetermined interval b in a staggered manner.

An etchant is sprayed to the upper and lower surfaces of the metal plate material 13. As indicated by arcs A in FIG. 1B, the metal plate material 13 is chemically dissolved and removed except for portions covered with the resist films 14a and 14b.

Figure 1C:
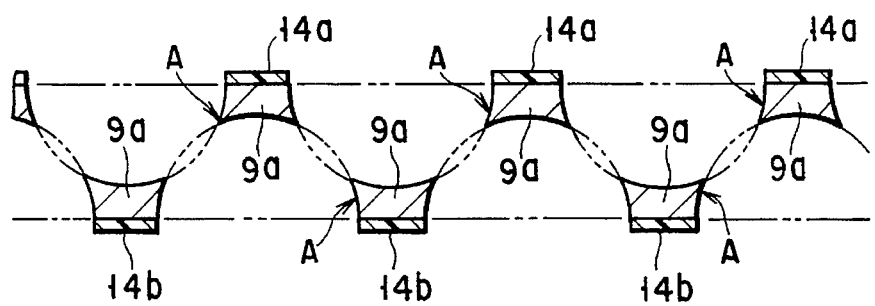

When etching progresses until the arcs A indicating the progress of etching are brought into contact with each other to slightly overlap each other so that the upper and lower surfaces communicate with each other, as shown in FIG. 1C, etching is ended.

Figure 5A:
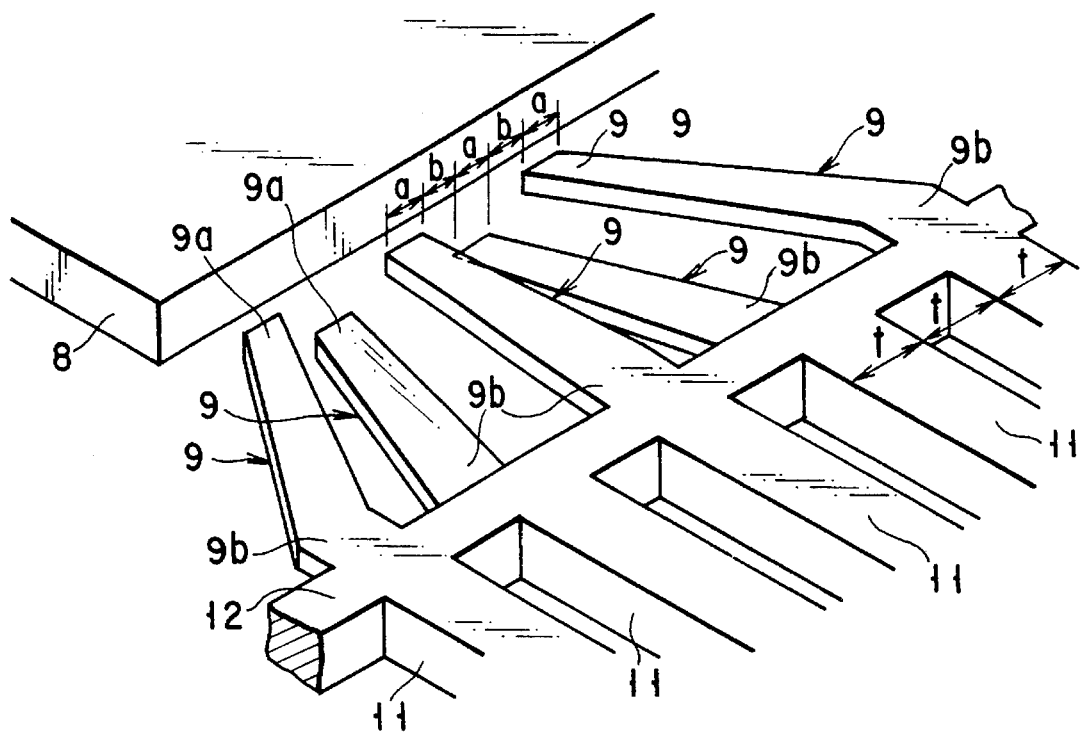

The resist films 14a and 14b are removed by washing. Then, as shown in FIGS. 1D and 5A, the leads 9 having the distal end portions with a width a are formed alternately along the upper and lower surfaces (front and rear sides) of the metal plate material 13 in a staggered manner.

As described above, the leads 9 are formed such that their width and interval are gradually increased from the distal end portions 9a toward the proximal end portions 9b and that their portions connected to the dam bar 12 are formed to have a width and an interval equal to t (t>b). The outer leads 11 on the outer side of the dam bar 12 have the same thickness t and the same interval t as those of the proximal end portions 9b of the leads 9.

Figure 1D:
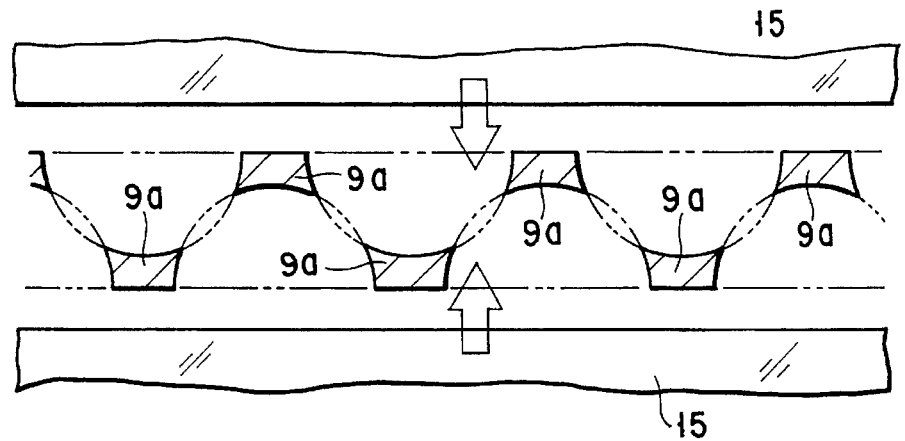
Figure 1E:
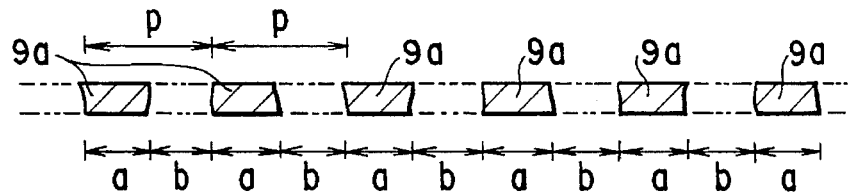
Figure 5B:
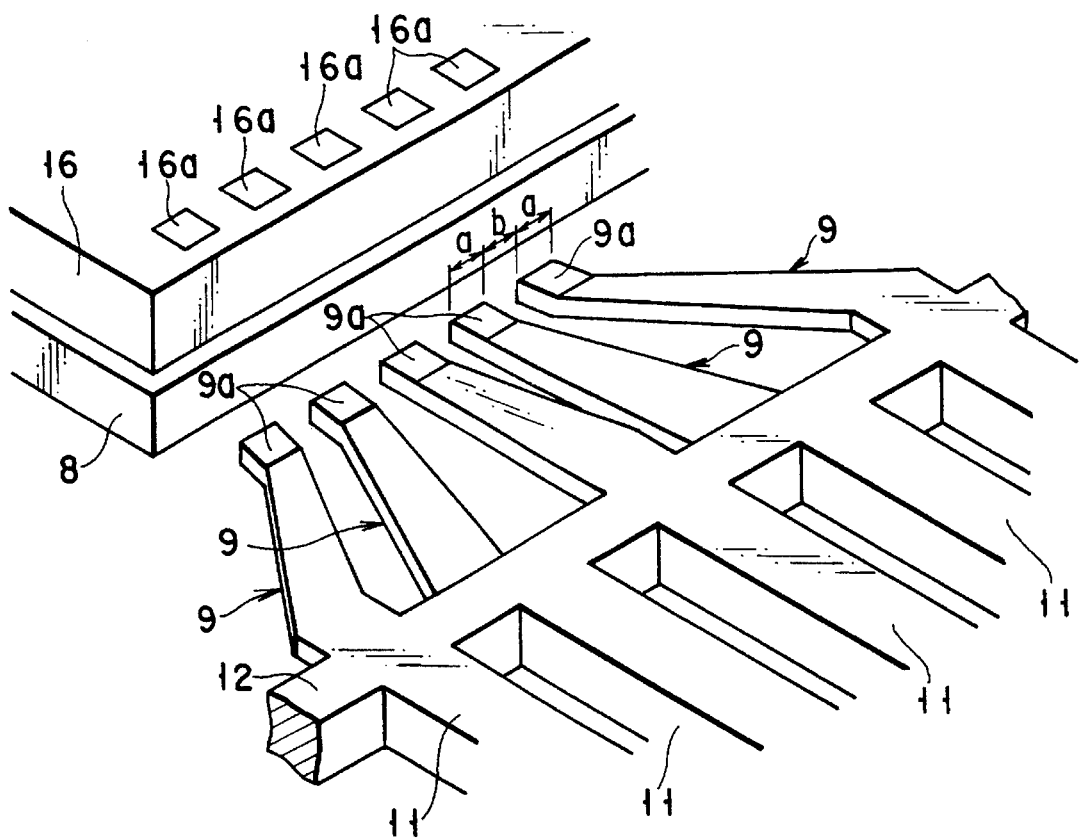

Finally, the distal end portions 9a of the leads 9 are pressed from the front and rear sides by using a coining tool 15 shown in FIG. 1D, thereby coining (flattening) the distal end portions 9a of the leads 9, and simultaneously the heights of the distal end portions 9a of all the leads 9 are aligned, as shown in FIGS. 1E and 5B.

Hence, the plurality of leads 9 having the distal end portions 9a with the width a and the interval b (the pitch P=a+b) that oppose the die pad 8 are formed. The outer leads 11 do not need the coining operation.

A process of mounting a semiconductor element on the lead frame 5 formed in this manner, thereby manufacturing a semiconductor package device, will be described.

As shown in FIG. 5B, a semiconductor element 16 is fixed on the die pad 8 by die bonding. When the semiconductor element 16 is fixed on the die pad 8, electrode pads 16a disposed on the upper surface of the semiconductor element 16 and the upper surfaces of the distal end portions 9a of the leads 9 are connected by gold wires 17 (wire bonding), as shown in FIG. 5C.

When the semiconductor element 16 and the leads 9 are connected, this semiconductor element 16 is encapsulated with a mold resin 18, as shown in FIG. 5D. Encapsulation with the mold resin 18 is performed such that a portion of the lead frame 5 on which the semiconductor element 16 is mounted and the distal end portions 9a of the leads 9 are located within, e.g., a die cavity, and the molten mold resin 18 is injected into the cavity.

Figure 5E:
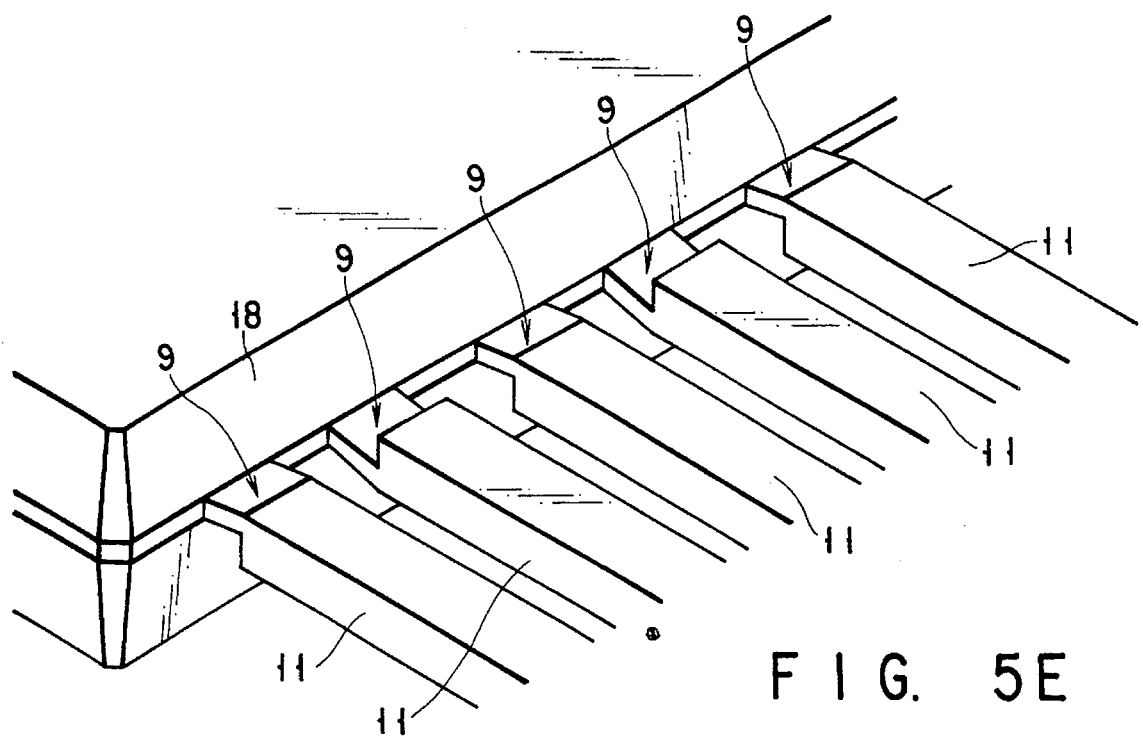
Figure 5F:
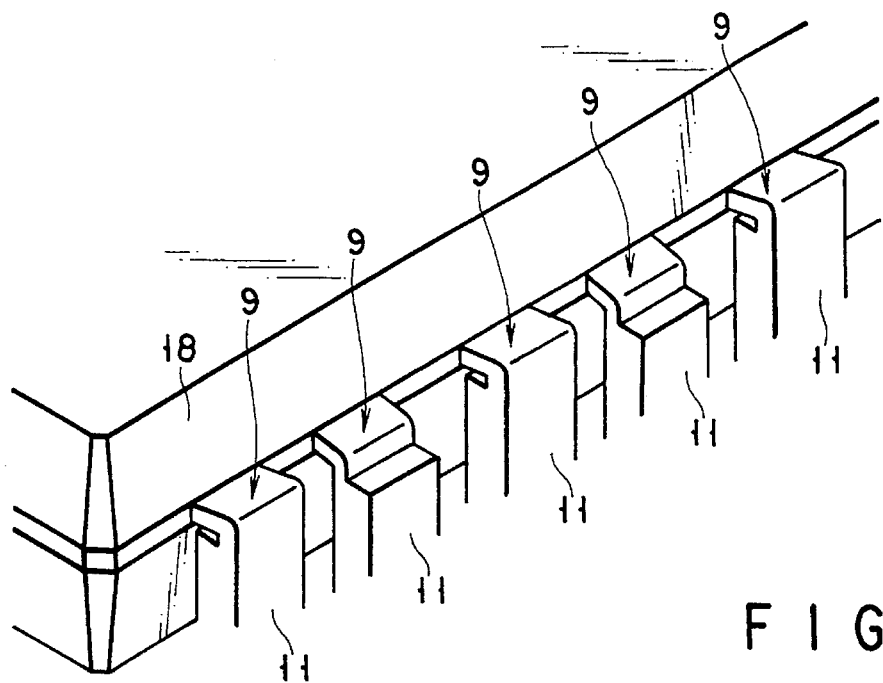

Subsequently, as shown in FIG. 5E, portions of the dam bar 12 located between the leads 9 (outer leads 11) are removed by cutting with a stamping unit. As shown in FIG. 5F, the other end of each of the outer leads 11 not continuous to the leads 9 is separated from the lead frame block 6, and this other end of each outer lead 11 is bent downward to form an outer terminal. The suspension pins 7 are cut on the outer side of the mold resin 18, thereby completing the semiconductor package device.

With this arrangement, effects to be described below are obtained.

First Effect

Conventionally, the width b of the leads to be formed and the etching width are the same. Hence, if a decrease in etching width is limited due to reasons such that the side-etching phenomenon is accelerated, leads having a width b smaller than the etching width cannot be formed.

More specifically, conventionally, since the lower limit of the etching width is equal to about the thickness t, leads having a width equal to or smaller than the thickness t cannot be formed. If the width b is decreased to a value smaller than t, the side-etching phenomenon occurs, so the quality of the lead frame is not guaranteed.

In contrast to this, according to the present invention, the interval b of the distal end portions 9a of the leads 9 to be formed can be set to equal to or smaller than the thickness t while the etching width (a+2b) is kept equal to the thickness t or more.

More specifically, according to the present invention, even when the etching width (a+2b) is limited to be equal to about the thickness t, i.e., (a+2b)=t, the interval b of the leads 9 satisfies b<(a+2b), so that the interval b of the leads 9 can be set to satisfy b<t, i.e., equal to or smaller than the thickness t.

Regarding the pitch P of the leads 9, since P=(a+b)<(a+2b), the pitch P can be set to satisfy P<t, i.e., to be equal to the thickness t.

Figure 7:
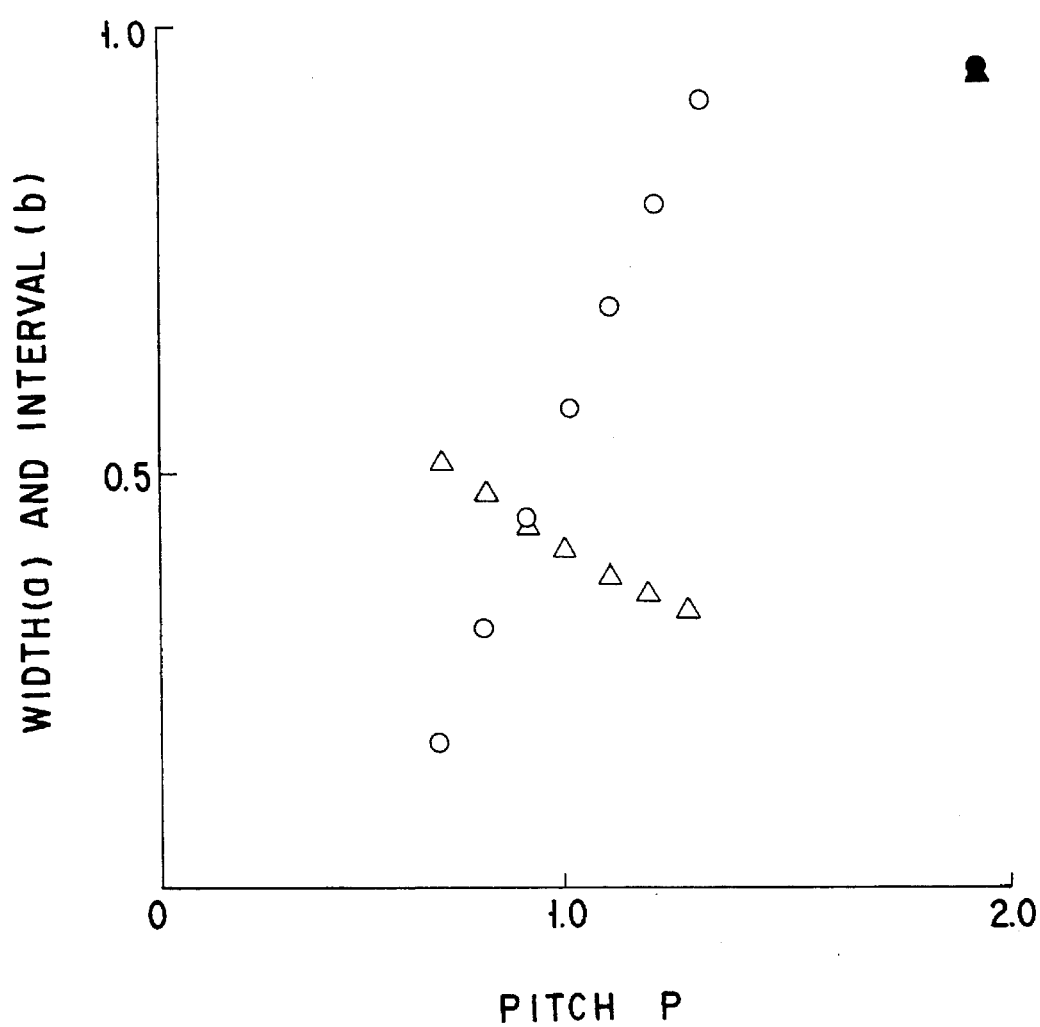
FIG. 7 is a graph showing the relationship among the width, interval, and pitch of the leads.

The graph shown in FIG. 7 represents the relationship among the width a, interval b, and pitch P of the leads 9 in a case wherein the thickness of the metal plate material 1 is set to 1.0, by plotting the width a and interval b of the adjacent leads 9 along the axis of ordinate and the lead pitch P=(a+b) along the axis of abscissa.

In formation of this graph, etching is stopped at a time point when the arcs A indicating the removing amount by etching are brought into contact with each other in FIG. 1C, and the width a and interval b of the leads 9 are obtained by drawing figures. In FIG. 7, the width a and interval b of the leads 9 are indicated by o and Δ, respectively.

Figure 6:
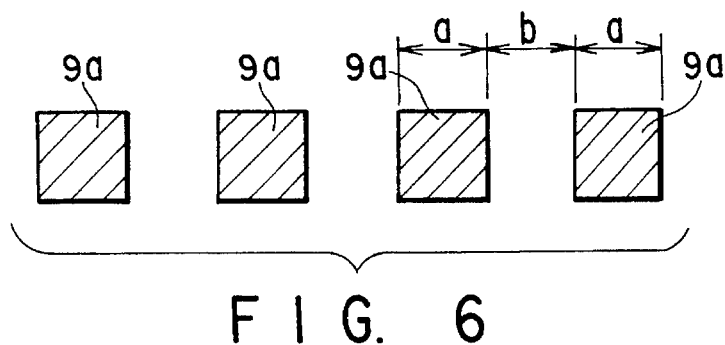
FIG. 6 is a sectional view showing the width and interval of the distal end portions of leads.

According to this graph, for example, in order to obtain leads 9 having the width a and interval b that are equal to each other, the pitch P=0.9 is obtained when the width a=0.45 and the interval b=0.45, as shown in FIG. 6.

In order to obtain leads having the width a and interval b that are equal to each other with the conventional arrangement, since the interval b cannot be set to be equal to or smaller than the thickness, both the width a and interval b become 1.0, as indicated by ● and ▲, respectively, and the pitch P=2.0 is obtained. Therefore, according to the present invention, the pitch P can be considerably decreased when compared to the case of the prior art technique.

Second Effect

Theoretically, since etching can be stopped at a time point when the arcs A indicating the removing amount by etching from the two surfaces of the metal plate material 1 are brought into contact with each other, as described above, the etching depth does not become larger than the etching width. Therefore, the side-etching phenomenon can be minimized.

Third Effect

Since the manufacturing process including coining of the lead frame 5 can be executed with substantially the same facilities as that for the conventional lead frame, this process is advantageous in terms of the manufacturing cost as well.

From the first to third effects described above, according to the present invention, a lead frame and a semiconductor package device that can sufficiently cope with recent and future multi-pin (high pin), smaller-pitch semiconductor elements can be obtained.

Figure 8A:
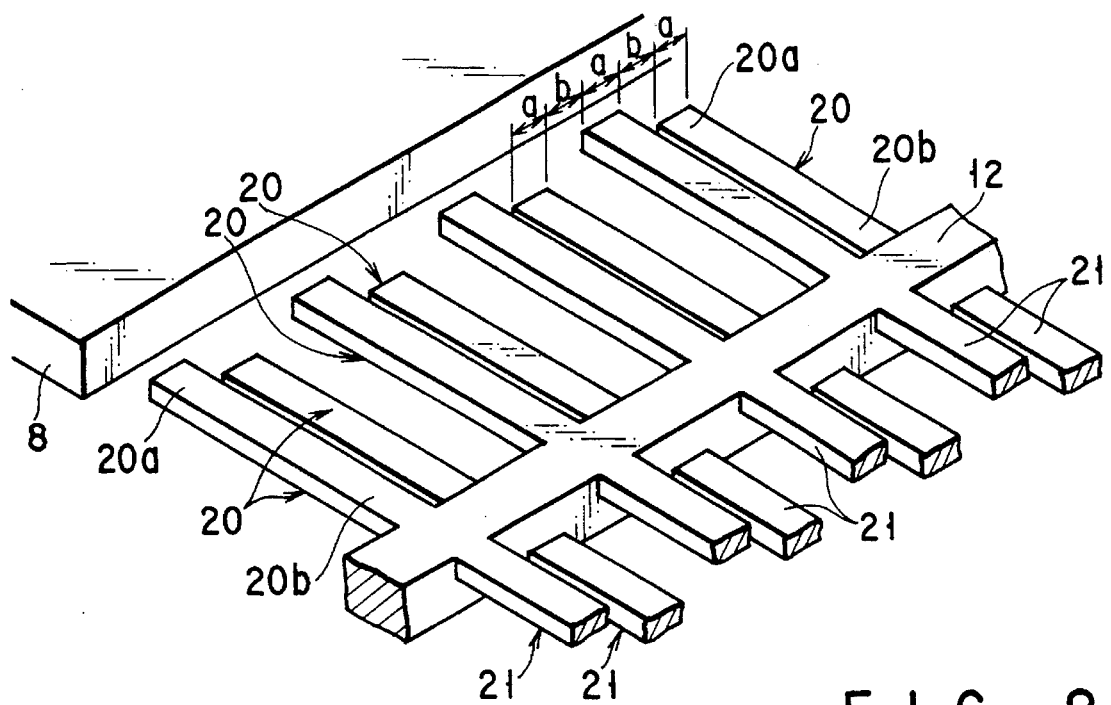
FIGS. 8A and 8B are views showing a process of forming leads according to the second embodiment of the present invention.
Figure 8B:
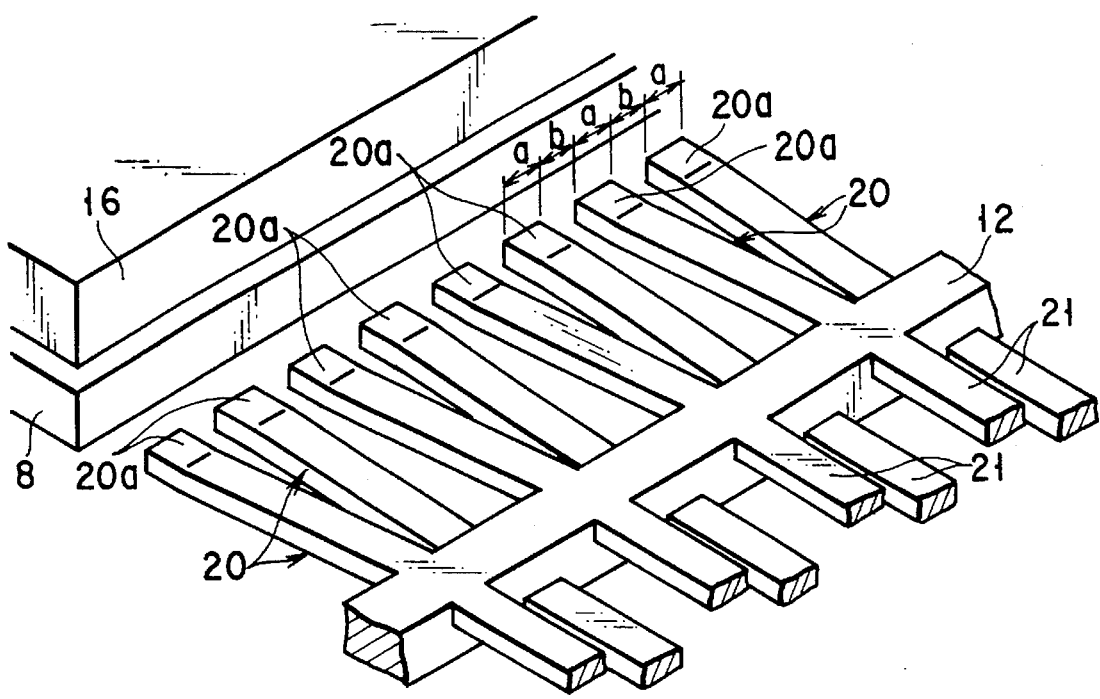
Figure 9A:
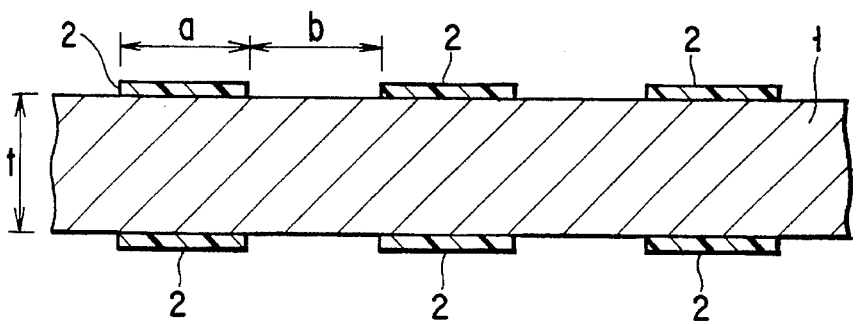
FIGS. 9A to 9E are views showing a process of forming lead according to the prior art technique.
Figure 9B:
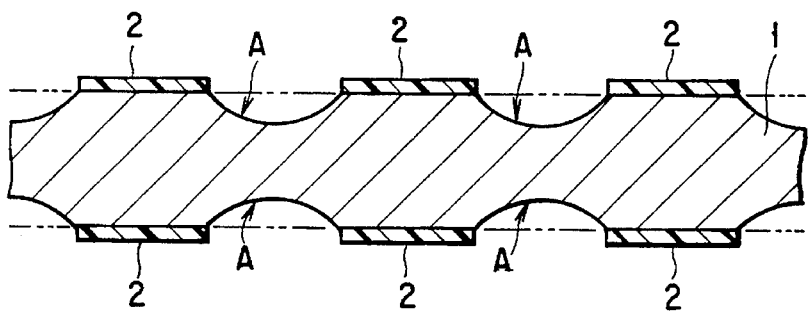
Figure 9C:
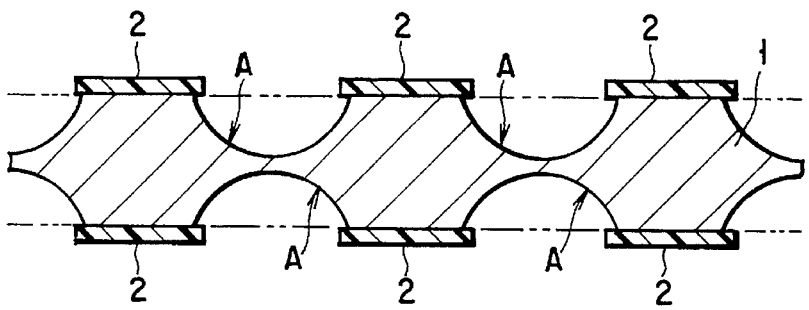
Figure 9D:
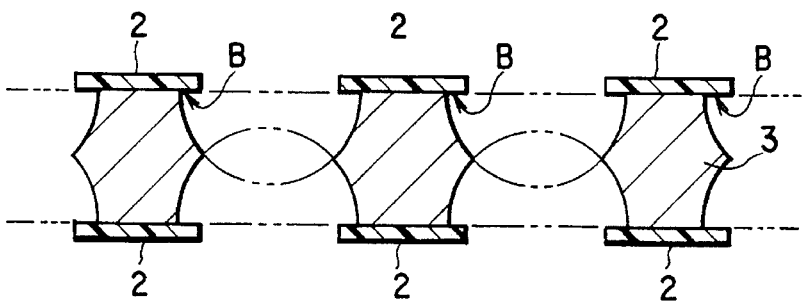
Figure 9E:
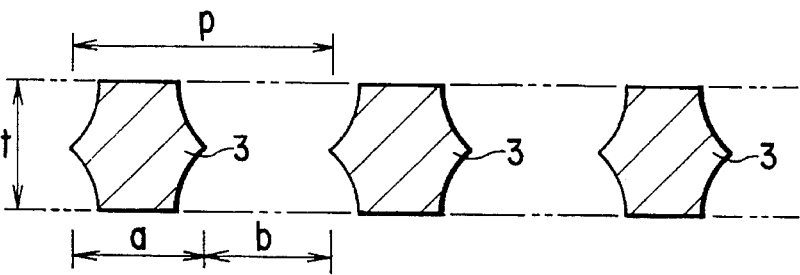

The second embodiment of the present invention will be described with reference to FIGS. 8A and 8B. Note that the same constituent elements as those in the first embodiment are denoted by the same reference numerals, and a detailed description thereof will be omitted.

Different from the leads 9 in the first embodiment, leads 20 of the second embodiment are formed such that their width a and interval b are substantially constant from their distal end portions 20a to proximal end portions 20b. The leads 20 are formed in accordance with the same manner as the leads 9 of the first embodiment, and the distal end portions 20a are aligned to have substantially the same height by the coining work, as shown in FIG. 8B.

Different from the outer leads 11 of the first embodiment, outer leads 21 of the second embodiment are formed in accordance with the same manner as the leads 20 to have the same width a and interval b as those of the leads 20.

Therefore, the outer leads 21 of a semiconductor package device fabricated by using this lead frame can have a pitch smaller than that of the outer leads 11 of the semiconductor package device of the first embodiment.

According to the second embodiment, the same effect as that of the first embodiment can be obtained. Moreover, since the interval and pitch of the outer leads 21 can be decreased, as described above, a lead frame suitable for higher-density packaging can be obtained.

The present invention is not limited to the first and second embodiments, but various changes and modifications may be made without departing from the spirit and scope of the invention.

For example, first, the width a and interval b of the leads need not comply with the graph shown in FIG. 7, but etching can be allowed to progress until the arcs A indicating the removing amount by etching overlap, as in the first embodiment. Even in this case, substantially the same effect as that of the first embodiment can be obtained.

Second, according to the first and second embodiments, the dam bar 12 is provided, and this dam bar 12 is removed by cutting in a later step. However, a dam bar 12 may be eliminated from the beginning.

Third, according to the first and second embodiments, the die pad 8 is provided within the lead frame block 6. However, if the semiconductor element 16 can be fixed within the lead frame block 6 without using a die pad 8, the die pad 8 can be omitted.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A lead frame comprising:

a lead frame block formed of a metal plate material having first and second opposite surfaces;

a plurality of leads projecting from the lead frame block having proximal end portions attached to the lead frame block, each proximal end portions having a thickness "t," and opposite distal end portions, the proximal end portions of the plurality of leads being attached at predetermined intervals alternately to the first and second surfaces of the lead frame block, the distal end portions being substantially the same height and being aligned with one another with each two adjacent distal end portions spaced from one another by an interval "b," wherein "t" is greater than "b".

2. A lead frame according to claim 1, wherein a die pads held by said lead frame block is provided at a position opposing said distal end portions of said leads.

3. A lead frame according to claim 1, wherein said distal end portions of said leads are formed to have a smaller width than that of said proximal end portions thereof.

4. A lead frame according to claim 1, wherein said distal end portions of said leads are formed to have a smaller interval than that of said proximal end portions thereof.

5. A lead frame according to claim 1, wherein said leads are formed to have substantially a constant width from said distal end portions thereof toward said proximal end portions thereof.

6. A lead frame according to claim 1, wherein said leads are formed to have substantially a constant interval from said distal end portions thereof toward said proximal end portions thereof.

7. A lead frame according to claim 1, wherein said lead frame block includes a dam bar for damming mold resin, and said proximal end portions of the leads are attached to the dam bar.

\* \* \* \* \*